(12) United States Patent
Lloyd et al.

(10) Patent No.: US 10,551,470 B2
(45) Date of Patent: Feb. 4, 2020

(54) CALIBRATION APPARATUS, CALIBRATION SYSTEM AND METHOD FOR CALIBRATING AT LEAST ONE OF THE SIGNAL GENERATOR AND A SIGNAL ANALYZER

(71) Applicant: Rohde & Schwarz GmbH & Co. KG, Munich (DE)

(72) Inventors: Paul Gareth Lloyd, Munich (DE); Simon Ache, Munich (DE); Michael König, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 188 days.

(21) Appl. No.: 15/712,605

(22) Filed: Sep. 22, 2017

(65) Prior Publication Data
US 2019/0094327 A1    Mar. 28, 2019

(51) Int. Cl.
*G01R 35/00* (2006.01)
*G01R 1/28* (2006.01)
*G01R 35/04* (2006.01)
*G01R 23/16* (2006.01)

(52) U.S. Cl.
CPC ............ *G01R 35/005* (2013.01); *G01R 1/28* (2013.01); *G01R 23/16* (2013.01); *G01R 35/04* (2013.01)

(58) Field of Classification Search
CPC ........ G01R 35/05; G01R 35/04; G01R 23/16; G01R 1/28
See application file for complete search history.

(56) References Cited

U.S. PATENT DOCUMENTS

| | | | | |
|---|---|---|---|---|
| 4,799,008 A * | 1/1989 | Kannari | ............. | G01R 31/3167 324/130 |
| 5,059,893 A * | 10/1991 | Hiral | .................. | G01R 31/2851 324/73.1 |
| 5,262,957 A * | 11/1993 | Hearn | ..................... | G01R 23/16 324/76.19 |
| 5,847,619 A * | 12/1998 | Kirisawa | ................. | H04L 27/20 332/103 |
| 9,861,305 B1 * | 1/2018 | Weber | .................. | A61B 5/1455 |
| 2002/0035437 A1 * | 3/2002 | Tingley | .................. | G01N 22/02 702/51 |
| 2002/0163381 A1 * | 11/2002 | Burt | ..................... | H03F 3/45941 330/2 |
| 2004/0185802 A1 * | 9/2004 | Fukui | ..................... | H03D 7/005 455/104 |

(Continued)

*Primary Examiner* — Dominic E Hawkins
(74) *Attorney, Agent, or Firm* — Christensen O'Connor Johnson Kindness PLLC

(57) ABSTRACT

A calibration apparatus for calibrating at least one of a signal generator and a signal analyzer is described, wherein the calibration apparatus comprises an input terminal for establishing a connection with the signal generator, an output terminal for establishing a connection with the signal analyzer, a reference signal source for providing a reference signal, and a combiner circuit for combining signals received. The combiner circuit has a first input connected to the reference signal source and a second input assigned to the input terminal, the combiner circuit having an output assigned to the output terminal. Further, a calibration system and a method for calibrating at least one of a signal generator and a signal analyzer are described.

19 Claims, 4 Drawing Sheets

(56) References Cited

U.S. PATENT DOCUMENTS

| | | | |
|---|---|---|---|
| 2005/0010092 A1* | 1/2005 | Weber | A61B 5/14551 |
| | | | 600/322 |
| 2006/0241887 A1* | 10/2006 | Sakayori | G01R 35/005 |
| | | | 702/117 |
| 2010/0052652 A1 | 3/2010 | Mitchell et al. | |
| 2010/0121597 A1* | 5/2010 | Steffens | G01R 13/0254 |
| | | | 702/79 |
| 2011/0025295 A1* | 2/2011 | Saroka | G01R 35/005 |
| | | | 324/72 |
| 2014/0368216 A1* | 12/2014 | Pailloncy | G01R 25/00 |
| | | | 324/602 |
| 2017/0234959 A1* | 8/2017 | Lee | G01R 35/005 |
| | | | 324/601 |
| 2018/0106841 A1* | 4/2018 | Lurz | G01R 23/02 |

* cited by examiner

CALIBRATION APPARATUS, CALIBRATION SYSTEM AND METHOD FOR CALIBRATING AT LEAST ONE OF THE SIGNAL GENERATOR AND A SIGNAL ANALYZER

FIELD OF THE DISCLOSURE

Embodiments of the present disclosure relate to a calibration apparatus for calibrating at least one of a signal generator and a signal analyzer. Further, embodiments of the present disclosure relate to a calibration system as well as a method for calibrating at least one of a signal generator and a signal analyzer by using a calibration system.

BACKGROUND

Modern communication devices use technologies for transmitting ultra-wideband signals having a bandwidth of 500 MHz wherein these signals correspond to millimeter waves having a center frequency, also called radio frequency, between 10 and 90 GHz. These technologies correspond to a new telecommunication standard that is beyond the current 4G telecommunication standard. Therefore, this standard is usually labeled as 5G. Due to these new transmission technologies, it is necessary to test and analyze such modern communication devices, also called devices under test, in the full spectrum available.

However, it has turned out that the analyses of such communication devices, namely the necessary tests and measurements, are limited by the performance of the test equipment itself. The test equipment usually comprises a signal generator and a signal analyzer which are connected to the device under test for inputting a radio frequency signal to be processed by the device under test and for analyzing the signal processed by the device under test.

Typically, the test equipment used for analyzing the communication devices with ultra-wideband transmission technologies causes a relatively high error-vector-magnitude (EVM) due to the signal characteristics of the 5G signals. The relatively high EVM results in a high inaccuracy of the measurements and analyses. The EVM errors usually occur in three domains, namely the amplitude domain, the frequency domain and the time domain.

Accordingly, there is a need for a possibility to analyze such communication devices, in particular 5G communication devices, in a more accurate manner.

SUMMARY

Embodiments of the present disclosure provide a calibration apparatus for calibrating at least one of a signal generator and a signal analyzer. The calibration apparatus comprises:
an input terminal for establishing a connection with the signal generator;
an output terminal for establishing a connection with the signal analyzer;
a reference signal source for providing a reference signal; and
a combiner circuit for combining signals received;
wherein the combiner circuit has a first input connected to the reference signal source and a second input assigned to the input terminal, the combiner circuit having an output assigned to the output terminal.

Accordingly, a calibration apparatus is provided that is used to calibrate at least one of a signal generator and a signal analyzer which are used for analyzing communication devices using 5G telecommunication technologies. Hence, the signal generator and the signal analyzer both may be calibrated prior to testing the device under test such that the components, which establish the test equipment, are calibrated appropriately. The test equipment is used for analyzing 5G telecommunication devices, namely the devices under test, after the respective calibration(s). The calibration apparatus comprises its own reference signal source in an integrated manner that can be used for calibrating the signal analyzer in an easy manner. The reference signal source outputs a stable and precise reference signal that can be used to calibrate at least one of the signal generator and the signal analyzer.

According to an aspect, the combiner circuit is pre-calibrated. Thus, it is ensured that the calibration apparatus itself has a well known behavior with regard to the processing of signal(s). The reference signal provided by the reference signal source and used for calibration purposes has well-defined characteristics due to the pre-calibrated combiner circuit that processes the reference signal before forwarding the reference signal to the output terminal. Therefore, the calibration of at least one of the signal generator and the signal analyzer can be done in an appropriate manner.

For instance, the reference signal source is a comb generator. Usually, comb generators provide good phase an amplitude flatness making them ideal for calibration purposes. The reference signal source established by the comb generator is a signal generator that provides a phase-calibrated frequency spectrum wherein the reference signal comprises harmonics of its input signal. The comb generator produces a very fast pulse repeatedly by a certain frequency wherein the pulses are like impulses. Thus, the pulses have a sharp rise time and a sharp fall time.

According to another aspect, the calibration apparatus comprises at least one adjustable attenuator. The attenuator may be controlled automatically by, for example, a remote unit, such that it can be adjusted without any manual input. This ensures that the attenuator can be adjusted promptly. The attenuator may be used to control, for example, to feedback control, the output level of the signal at the output terminal of the calibration apparatus irrespective of the input level. Therefore, the adjustable attenuator can ensure to maintain the output level at a constant level when the input level varies and the adjustable attenuator can also ensure to vary the output level when the input level is constant.

In some embodiments, the at least one attenuator is positioned between the combiner circuit and at least one of the input terminal and the output terminal. Thus, the signal(s) received via the input terminal can be attenuated appropriately. Alternatively or supplementarily, the signal(s) provided by the combiner circuit may be attenuated prior to be outputted via the output terminal. Accordingly, the variation of the signal level by the attenuator may take place prior and/or after the combiner circuit.

According to an embodiment, the combiner circuit comprises the at least one attenuator, the at least one attenuator being allocated to at least one of the first input, the second input and the output. Thus, the signal processed by the combiner circuit is attenuated by the combiner circuit itself. As the attenuator may be allocated to the first input that is connected to the reference signal source, the reference signal provided by the reference signal source may be attenuated respectively.

In general, the calibration apparatus comprises at least one adjustable attenuator for attenuating at least one of the different signals processed by the calibration apparatus.

Another aspect provides that the calibration apparatus comprises at least one of a summation unit and a reflected signal verification unit for measuring a reflection level. The summation unit may be established by a combiner such as a 3 dB hybrid combiner or a so called Wilkinson combiner. The summation unit ensures that different signals forwarded via both inputs of the combiner circuit may be summed up in an appropriate manner.

The reflected signal verification unit may be used to determine the standing-wave-ratio (SWR) of the signal(s) processed in order to be able to determine the reflected power, namely the reflection level. The reflected signal verification unit can be established by a directional coupler, for instance a dual directional coupler. The at least one reflected signal verification unit may be assigned to at least one of the input terminal and the output terminal.

Thus, the calibration system is enabled to determine the accuracy of the calibration and/or to warn a user of the calibration system due to a high and critical reflection level.

Further, embodiments of the present disclosure provide a calibration system comprising a calibration apparatus as mentioned above and at least one of the signal generator connected to the input terminal and a signal analyzer connected to the output terminal. Accordingly, the calibration system can be used to calibrate the signal generator and/or the signal analyzer depending on the respective arrangement of the calibration system.

The signal analyzer may be a scalar measurement device that is capable of measuring at least a power level. In addition, the signal analyzer may comprise a filter unit for isolating or reducing specific frequencies that are of special interest for the calibration(s).

Thus, the calibration system comprises at least one adjustable attenuator that is positioned between the signal generator and the signal analyzer such that the power level of the signal(s) fed to the signal analyzer can be varied appropriately by the at least one adjustable attenuator.

According to an aspect, at least one of the signal generator and the signal analyzer is connected to the calibration apparatus via at least one respective connecting element. The at least one connecting element shall be comparable to the connecting element that is used during the testing of the communication device. In other words, an equivalent or the same connecting element is used for the calibration(s) of the components of the test equipment and the testing of the device under test with the dedicated components. Accordingly, it is ensured that all (active) components of the test equipment are pre-calibrated in the respective arrangement that will be used for testing the communication device later. This means that the same (inactive) connection elements are used during the calibration(s).

For instance, the at least one connecting element comprises a cable. Thus, the calibration apparatus is connected to the signal generator and the signal analyzer via cables that are enabled to forward the signals in an appropriate manner. The same cables may also be used during the testing of the device under test that is connected to the signal generator and the signal analyzer via the same cables or at least via equivalent ones. The cable may be an optical cable. The connecting element(s) may further comprise connector(s), test fixture(s), and so on.

According to another aspect, the signal generator and the signal analyzer both are in an operational state during a calibration state of the signal generator. Thus, the signal generator and the signal analyzer both are used to calibrate the signal generator. Despite the signal generator and the signal analyzer, the calibration apparatus is also in its operational state for calibrating the signal generator.

Another aspect provides that the signal generator is in a nonoperational state during a calibration state of the signal analyzer. Thus, the signal analyzer may be calibrated by the (pre-calibrated) calibration apparatus and the signal analyzer. This ensures that it is possible to calibrate the signal analyzer in an appropriate manner as the (non-calibrated) signal analyzer is not needed for calibrating the signal analyzer due to the integrated reference signal source. Accordingly, the signal analyzer may be calibrated first whereas the signal generator is calibrated later by using the already calibrated signal analyzer.

Generally, calibration data for the signal generator as well as the calibration data for the signal analyzer may be derived from the signal measured by the signal analyzer.

For example, the signal outputted at the terminal output is at least one of a reference signal from the reference signal source combined with a generated signal of the signal generator and a reference signal from the reference signal source alone. Depending on the respective calibration, namely the analyzer calibration or the generator calibration, the signal outputted at the terminal output may correspond to the combined signal or the reference signal alone as the signal generator is in its nonoperational state during the calibration of the signal analyzer (analyzer calibration). However, the signal generated by the signal generator may also be processed by the calibration apparatus without being combined with the reference signal during the generator calibration.

According to an embodiment, the calibration system comprises a controller unit that is connected to at least one of the calibration apparatus, the signal generator, and the signal analyzer for controlling purposes. The controller unit may control the different components in order to execute certain test scenarios. The controller unit may also be established in an integrated manner, for instance integrated in the calibration apparatus, the signal generator or the signal analyzer. The respective component of the calibration system may be connected to the other components.

The controller unit may have a math processor for determining the settings of the equalization filters, in particular their appropriate calibration data. This determination may be done in a continuous manner for the signal generator and/or the signal analyzer. The math processor may be configured to do curve fittings based on the data gathered, to interpolate the data gathered or to determine these data by other approaches such as the "nearest neighbor" approach, for instance.

Alternatively, the math processor may be provided separately, for instance by another component of the calibration test system. This unit may be connected to at least one of the controller unit, the signal analyzer, the calibration apparatus, and the signal generator.

The calibration may be controlled automatically provided that a certain deviation or error is detected. Thus, the calibration time can be reduced appropriately.

Further, embodiments of the present disclosure provide a method for calibrating at least one of a signal generator and a signal analyzer by using a calibration system as mentioned above, with the following steps:

performing at least one of an analyzer calibration and a generator calibration; and determining respective correction parameters.

Accordingly, the signal generator and/or the signal generator may be calibrated by using the calibration system in an appropriate manner. The correction parameters obtained during the calibration(s) correspond to equalization coefficients which are used for equalizing the frequency domain appropriately. In general, the equalization corresponds to the reversal of distortion incurred by a signal transmitted.

An equalization of the frequency domain is provided by performing the calibration at a constant incident power level at the signal analyzer. This constant incident power level is ensured by controlling the at least one adjustable attenuator of the calibration system appropriately, in particular the one of the calibration apparatus. Thus, these equalization coefficients provide the calibration parameters with regard to the frequency domain.

For instance, the analyzer calibration is performed at different incident power levels at the signal analyzer. The several incident power levels used during the analyzer calibration may correspond to a sweep input level.

Moreover, the generator calibration can be performed by using a sweep output level of the signal generator.

For generator calibration, the phase/amplitude versus frequency characteristics of the signal generator may be adjusted in order to cancel the resulting signal at the output terminal of the calibration apparatus. For instance, a 180° phase shift is applied in order to provide an anti-phase for cancellation as this phase shift is easier to detect than an in-phase condition (amplitude modification). The inevitable amplitude/phase imbalance in the calibration apparatus, which are well-known, determined and stable, may also be taken into account for determining the calibration coefficients.

According to an aspect, the calibration apparatus is controlled during the analyzer calibration such that a sweep input level at the signal analyzer is provided, wherein the reference signal source outputs a constant power level. Since the reference signal source has amplitude flatness, the calibration apparatus, in particular the combiner circuit, is controlled such that the power level of the signal outputted and forwarded to the signal analyzer is varied in order to generate the sweep input level at the signal analyzer. For instance, the (separately formed) controller unit controls the calibration apparatus appropriately. Alternatively or supplementarily, the signal analyzer controls the calibration apparatus, in particular wherein the controller unit is integrated in the signal analyzer.

Another aspect provides that the calibration apparatus is controlled during the generator calibration such that a quasi-constant input level at the signal analyzer is maintained. This means that the calibration apparatus is controlled such that the sweep output level of the signal generator is balanced by the setting of the calibration apparatus, in particular the setting of the attenuator(s). The appropriate equalization coefficients (equalization parameters) are derived by the signal analyzer.

The equalization of the amplitude domain is provided by the power levels used during the calibration(s), in particular the sweep input level at the signal analyzer for the analyzer calibration and the sweep output level of the signal generator during the generator calibration.

According to another aspect, a frequency-power table is generated for at least one of the analyzer calibration and the generator calibration, in particular the respective equalization coefficients or rather equalization parameters. Thus, the calibration or equalization coefficients are stored in a two- or three-dimensional frequency-power table, for instance. The frequency-power table may correspond to a look-up table (LUT).

Alternatively, a multi-variable polynomial fit may be used for providing a correction function used for calibrating the calibration system, in particular the individual components of the calibration system used for the test equipment.

Another alternative provides a sample-by-sample correction, an interpolation or a so called "nearest-neighbor" approach for determining the respective calibration/correction parameters.

Furthermore, at least one of the analyzer calibration process and the generator calibration process is repeated for different radio frequencies which are also called center frequencies. Accordingly, the time domain equalization is also ensured while performing the calibration(s).

Moreover, the generator calibration may be implemented with a pre-correction that dynamically corrects the signal processed in one or more of the error domains, namely the frequency domain, the amplitude domain and the time domain.

The analyzer calibration may be implemented with a post-correction correcting in one or more of the above mentioned error domains, namely the frequency domain, the amplitude domain and the time domain.

During the calibration(s), the at least one adjustable attenuator may be used in a discrete or continuous automatic level control mode. Thus, the efforts of an amplitude domain correction by the signal analyzer are reduced.

As already mentioned, the response coefficients determined at the appropriate power level and radio frequency are calculated and stored, for instance in a look-up table (LUT). This is repeated for two or more other power levels and/or radio frequencies in order to calibrate the signal analyzer appropriately, namely in all three domains.

The above mentioned processes (different steps of analyzer calibration) are repeated for the generator calibration. This time, the (non-calibrated) signal generator is connected to the signal analyzer via the calibration apparatus. This means that the radio frequency and/or the output level are/is modified while the equalization of the frequency domain is performed at each step.

The at least one attenuator may be switched off during these steps.

Accordingly, the complete calibration system is calibrated in all three domains such that the components of the calibration system are calibrated appropriately which are used for testing the device under test.

In general, it is ensured that at least the frequency response (amplitude/phase versus frequency) of the components used by the test equipment for testing the device under test is compensated such that the measurement results obtained by the testing(s) show what the device under test outputs.

Therefore, the frequency response is compensated by the setting of the appropriate filter(s) of the components which are also called equalization filters. Thus, the settings of the filter(s) correspond to the equalization coefficients. The filter(s) is/are set such that the distortion occurred by the signal transmission is equalized. In an ideal scenario, a flat frequency response is obtained due to the equalization.

DESCRIPTION OF THE DRAWINGS

The foregoing aspects and many of the attendant advantages of the disclosed subject matter will become more readily appreciated as the same become better understood by reference to the following detailed description, when taken in conjunction with the accompanying drawings, wherein.

DETAILED DESCRIPTION

The detailed description set forth below in connection with the appended drawing, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
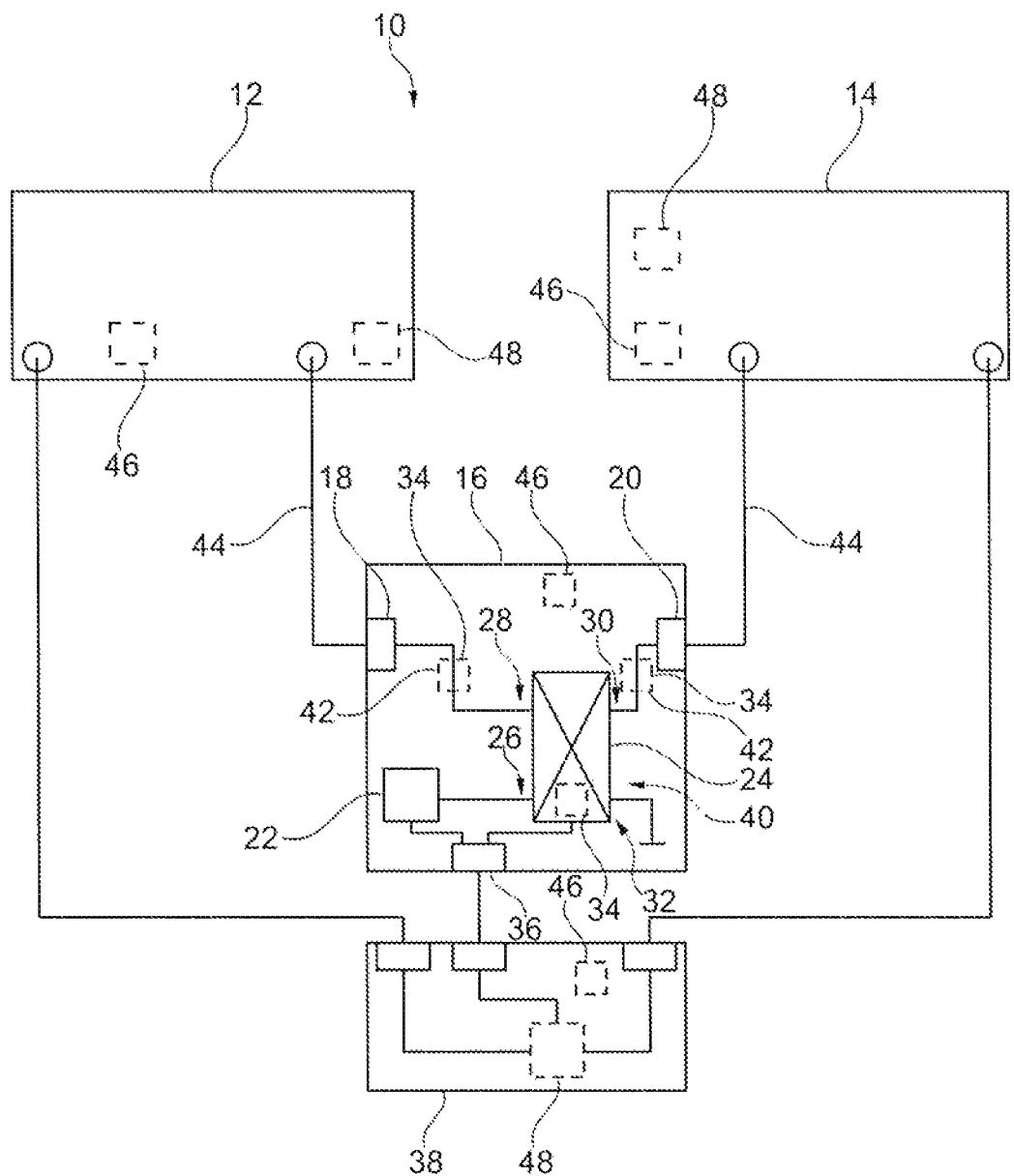
FIG. 1 shows a schematic overview of one representative embodiment of a calibration system according to the disclosure.

In FIG. 1 a calibration system 10 is shown that comprises a signal generator 12 and a signal analyzer 14. The calibration system 10 is used for calibrating at least one of the signal generator 12 and the signal analyzer 14.

The signal generator 12 and the signal analyzer 14 both are connected to a calibration apparatus 16 being also part of the calibration system 10. For connecting purposes, the calibration apparatus 16 has an input terminal 18 and an output terminal 20.

The signal generator 12 is connected to the input terminal 18 such that a connection between the calibration apparatus 16 and the signal generator 12 is established. The signal analyzer 14 is connected to the output terminal 20 such that a connection is established between the signal analyzer 14 and the calibration apparatus 16.

The calibration apparatus 16 comprises an integrated reference signal source 22 and an integrated combiner circuit 24. Accordingly, the reference signal source 22 and the combiner circuit 24 are commonly housed in the housing of the calibration apparatus 16.

The combiner circuit 24 has a first input 26 that is connected to the reference signal source 22 such that the combiner circuit 24 and the reference signal source 22 are interconnected with each other. Further, the combiner circuit 24 has a second input 28 that is assigned to the input terminal 18 of the calibration apparatus 16. Hence, the signals forwarded to the calibration apparatus 16 via the input terminal 18 from the separately formed signal generator 12 are received by the combiner circuit 24 via the second input 28. Moreover, the combiner circuit 24 has an output 30 that is assigned to the output terminal 20 such that the signals processed by the combiner circuit 24 are outputted via the output terminal 20 in order to be forwarded to the signal analyzer 14. As shown in the embodiment of FIG. 1, the combiner circuit 24 also has a second output 32 that is grounded.

The calibration apparatus 16, and in some embodiments the combiner circuit 24, comprises at least one attenuator 34 being an adjustable attenuator for attenuating the power level of the signal(s) processed. The at least one attenuator 34 may be adjusted by a (for example, remote) unit in an automatic manner such that no manual input is required.

The calibration apparatus 16 may comprise at least one control interface 36 such that the calibration apparatus 16 can be connected to a separately formed controller unit 38. As shown in FIG. 1, the controller unit 38 is also connected to the signal generator 12 and the signal analyzer 14 for emitting and/or receiving appropriate control signals wherein these control signals can be processed by the controller unit 38. Alternatively, the controller unit 38 may be established by an integrated controller unit of the signal generator 12, the signal analyzer 14 or the calibration apparatus 16.

In general, the controller unit 38 is used for setting the adjustable attenuator 34 appropriately as will be described later. Thus, the controller unit 38 may be the remote unit that is used to set the attenuator 34 automatically in response to appropriate control signals.

In some embodiments, the at least one attenuator 34 may be interposed between the combiner circuit 24 and the input terminal 18 such that the signals forwarded to the combiner circuit 24 are attenuated by the attenuator 34. In other embodiments, the at least one attenuator 34 can be located between the combiner circuit 24 and the output terminal 20 such that the signals outputted by the combiner circuit 24 are attenuated. The at least one adjustable attenuator 34 may also be provided within the combiner circuit 24 wherein the attenuator 34 is located to at least one of the first input 26, the second input 28 and the output 30.

In general, the calibration apparatus 16 may comprise more than one adjustable attenuator 34 such that different attenuators 34 can be used for adapting the power level of the signal(s) processed in a different manner.

As described above, the combiner circuit 24 has two inputs, namely the first and second input 26, 28, such that two different signals may be summed by the combiner circuit 24. Therefore, the combiner circuit 24 comprises a summation unit 40. The summation unit 40 may be established by a 3 dB hybrid combiner or a Wilkinson combiner.

The calibration apparatus 16 also has at least one reflection signal verification unit 42 for measuring a reflection level of the signals processed. As shown in FIG. 1, two reflected signal verification units 42 are provided which are allocated to the output terminal 20 and the input terminal 18. The reflected signal verification units 42 may be established by directional couplers, for example by dual directional couplers.

The signal verification units 42 are used to verify the standard of performance, for instance by verifying the standing-wave-ratio (SWR) of the signals processed. The data obtained can be used for warning the user of the calibration system 10 with regard to high reflection levels.

In general, the calibration system 10 shown in FIG. 1 can be used for calibrating the signal analyzer 14 and the signal generator 12 in a successive manner.

In a full setting as shown in FIG. 1, the signal generator 12 and the signal analyzer 14 both are connected to the calibration apparatus 16 via connecting elements 44. The connecting elements 44 may comprise cables, fixtures, connectors and other parts for establishing the respective connections.

Figure 2:
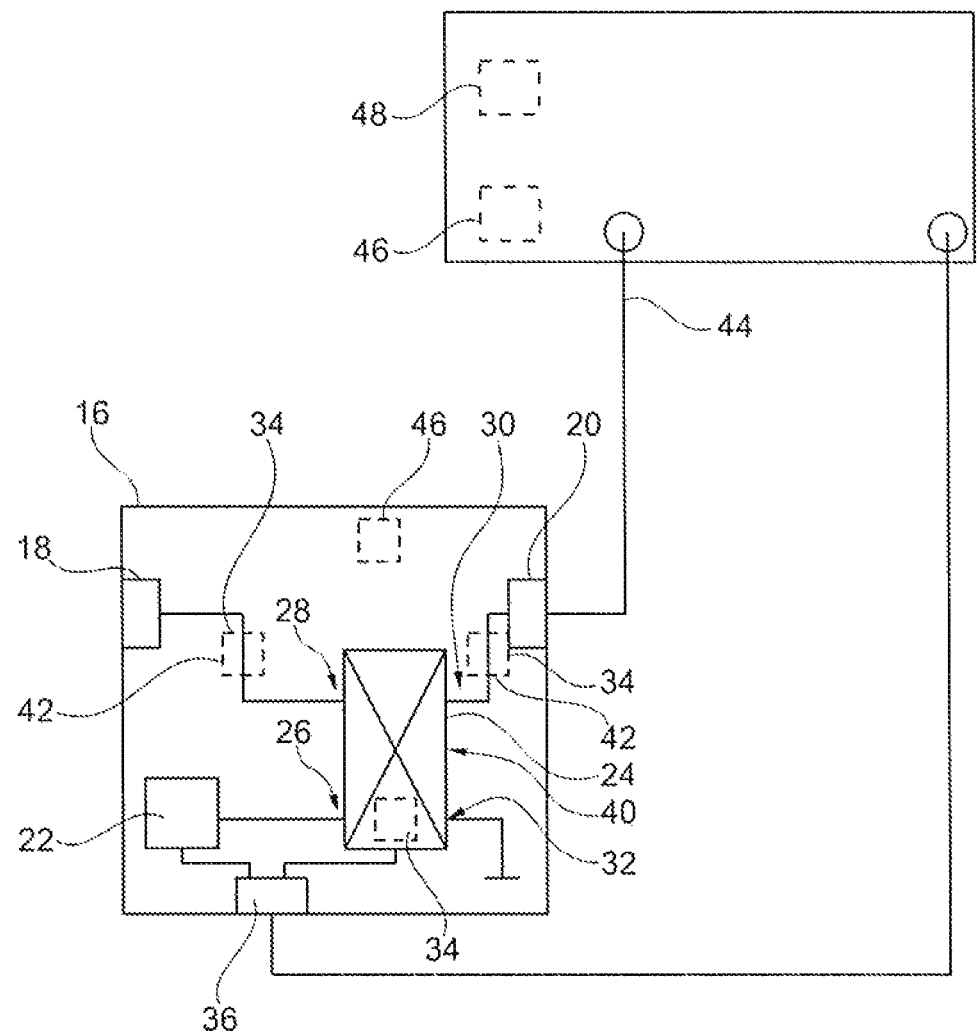
FIG. 2 shows a schematic overview of the embodiment of FIG. 1 during the analyzer calibration.

In FIG. 2, a first schematic overview is shown that corresponds to the analyzer calibration. In this embodiment, the signal analyzer 14 and the calibration apparatus 16 are directly coupled via their respective control interfaces 36 such that no separately formed controller unit is provided as it is integrated in the signal analyzer 14, for instance. During the analyzer calibration, the signal generator 12 is in its non-operational state. Therefore, the signal generator 12 is not shown in FIG. 2.

Hence, only the integrated reference signal source 22 provides a reference signal that is processed by the calibration apparatus 16, for example, the combiner circuit 24, and outputted at the output terminal 20 for being fed to the signal analyzer 14. The reference signal source 22 provides a known signal with a known power level that is controlled by the attenuator(s) 34. Thus, a known power level is inputted to the signal analyzer 14 for frequency domain equalization. The appropriate response coefficients are determined, namely the equalization coefficients of the signal analyzer 14.

Then, a sweep input level is provided at the input of the signal analyzer 14 for amplitude domain equalization. This sweeping is ensured by controlling the adjustable attenuator(s) 34 appropriately such that different power levels are inputted to the signal analyzer 14. For each power level, the aforementioned frequency domain equalization is done. Thus, the amplitude domain is equalized as well.

As already mentioned, the signal analyzer 14 controls the attenuator 34 directly. However, a separately formed controller unit 38 may also be provided for controlling purposes as shown in FIG. 1.

Moreover, the measurements are also repeated at different radio frequencies (center frequencies) such that the correction parameters are also provided for different radio frequencies. Accordingly, the calibration also takes the time domain into account when determining the equalization parameters.

Figure 3:
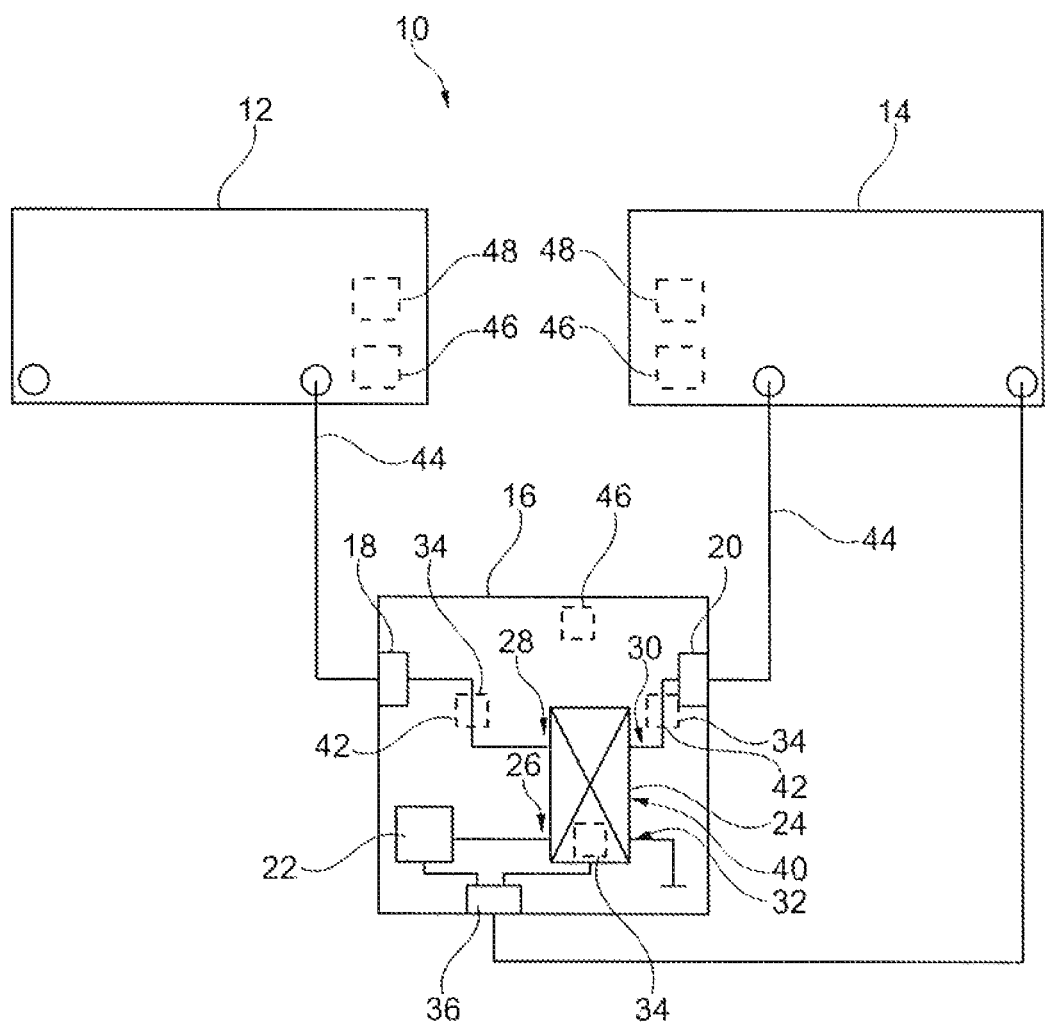
FIG. 3 shows a schematic overview of the embodiment of FIG. 1 during the generator calibration.

Once the analyzer calibration is done, a generator calibration may be performed as shown in FIG. 3 wherein the signal generator 12 and the already calibrated signal analyzer 14 are used in addition to the calibration apparatus 16.

As described, the signal analyzer 14 has already a calibration setting that is good for different amplitudes, frequencies and/or radio frequencies as all three domains were taken into account during the calibration. Accordingly, the signal generator 12 may now be calibrated in an appropriate manner.

The output signal of the signal generator 12 may be swept wherein equalization coefficients are derived by the signal analyzer 14. In a similar manner to the analyzer calibration, equalizations of the frequency and the amplitude domains are provided. The output signal of the signal generator 12 can be processed alone such that the generated signal is forwarded to the output terminal 20.

Alternatively, the generated signal is combined with the reference signal of the reference signal source 22 such that the combined signal is forwarded to the output terminal 20. This combined signal may be generated by using the summation unit 40 of the combiner circuit 24 appropriately.

The calibration apparatus 16, for example, the adjustable attenuator(s) 34, may be controlled during the generator calibration such that a quasi-constant input level at the signal analyzer 14 is maintained even though a sweep output level of the signal generator 12 is provided. Thus, a preferred input level may be supplied to the signal analyzer 14. For example, the signal generator 12 is calibrated over a greater dynamic range than the signal analyzer 14.

The generator calibration may also be repeated for different center frequencies such that the time domain is also taken into account during the calibration(s).

Then, the signal generator 12 and the signal analyzer 14 are calibrated appropriately, for example, in all three domains, namely the frequency, amplitude and time domains.

In general, the appropriate calibration coefficients derived by at least one of the analyzer calibration and the generator calibration may be stored in an internal memory 46 as a two-dimensional or three-dimensional look-up table depending on the test goal. This look-up table can be used for interpolating the data gathered appropriately.

Alternatively, a multi-variable polynomial fit may be generated by at least one math processer 48 wherein the polynomial fit is used for calculating the appropriate correction parameters. In another alternative, a sample-by-sample correction may be used for obtaining the correction parameters. Further, a so called nearest-neighbor approach may be applied for determining the correction parameters.

In the shown embodiment of FIG. 1, the at least one math processer 48 is integrated in the controller unit 38. However, the at least one math processer 48 may be separately formed or integrated in at least one of the signal generator 12, the signal analyzer 14, and the calibration apparatus 16.

Figure 4:
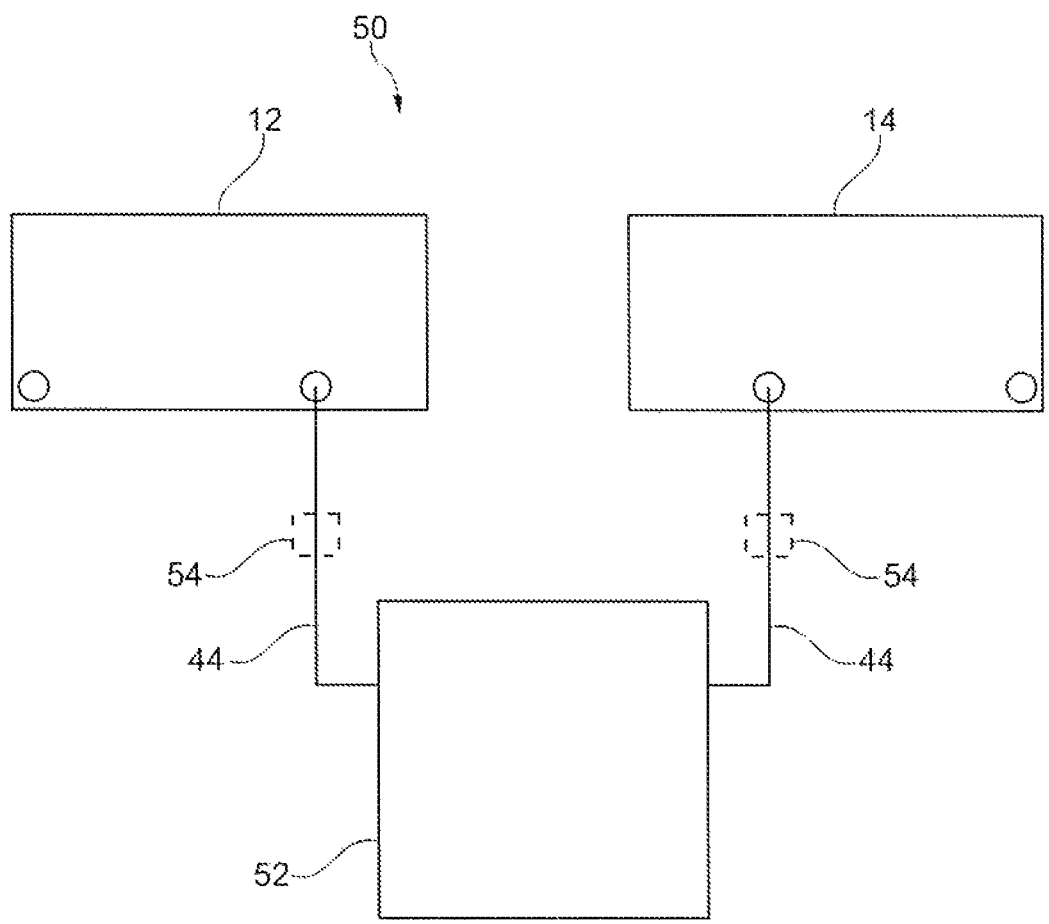
FIG. 4 shows a schematic overview of a test equipment that is calibrated according to one representative embodiment of a method according to the disclosure.

Due to the calibrations performed, the whole test equipment 50, which is provided by the signal generator 12, the signal analyzer 14 as well as the connection elements 44, has been calibrated in an appropriate manner, in particular in all domains. Therefore, the test equipment 50 can be used for testing and/or analyzing a device under test 52 as shown in FIG. 4.

Thus, the calibration apparatus 16 is disconnected from the signal generator 12 and the signal analyzer 14 wherein the device under test 52 is connected to the signal generator 12 and the signal analyzer 14 in order to be tested in an appropriate manner.

The already determined calibration coefficients are applied to the signal generator 12 and the signal analyzer 14 respectively in order to have an already calibrated test equipment 50. The calibration coefficients applied to the signal generator 12 depend on the operating output level and/or frequency. In a similar manner, the calibration coefficients applied to the signal analyzer 14 depend on the observed level and/or frequency.

Accordingly, the respective internal memory 46 is accessed or the appropriate calibration coefficients are provided by the math processor(s) 48 in order to obtain the calibration coefficients for the power level and/or the frequency.

This means that the signal generator 12 generates a signal that is equalized in frequency, power and radio frequency wherein the signal analyzer 14 analyses the incoming signal with the corresponding correction parameters in order to analyze the characteristics of the device under test 52 accurately.

The test equipment 50 may comprise test units 54 that comprise Standing-Wave-Ratio monitors such as (dual) directional couplers, variable attenuators for varying the power level(s) or other controllable components used for the testing of the device under test 52.

It is ensured that the 5G communication devices (devices under test 52) can be tested and analyzed by using ultra-wideband signals and the appropriate technologies wherein the error-vector-magnitude (EVM) can be reduced to be less than 1%, in particular wherein the error-vector-magnitude (EVM) can be eliminated completely. Accordingly, more accurate tests of such devices are possible.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A calibration apparatus for calibrating at least one of a signal generator and a signal analyzer, said calibration apparatus comprising:
    an input terminal for establishing a connection with said signal generator;
    an output terminal for establishing a connection with said signal analyzer;
    a reference signal source for providing a reference signal; and
    a combiner circuit for combining signals received;
    wherein said combiner circuit is pre-calibrated such that said calibration apparatus itself has a well-known behavior with regard to the processing of signals,
    wherein said combiner circuit has a first input directly connected to said reference signal source such that said reference signal provided by said reference signal source is processed by said pre-calibrated combiner circuit,
    wherein said combiner circuit has a second input assigned to said input terminal,
    wherein said combiner circuit has an output assigned to said output terminal, and
    wherein said calibration apparatus is configured to calibrate at least one of said signal generator or said signal analyzer.

2. The calibration apparatus according to claim 1, wherein said reference signal source is a comb generator.

3. The calibration apparatus according to claim 1, wherein said calibration apparatus comprises at least one adjustable attenuator.

4. The calibration apparatus according to claim 3, wherein said at least one attenuator is positioned between said combiner circuit and at least one of said input terminal and said output terminal.

5. The calibration apparatus according to claim 3, wherein said combiner circuit comprises the at least one attenuator, said at least one attenuator being allocated to at least one of said first input, said second input and said output.

6. The calibration apparatus according to claim 1, wherein said calibration apparatus comprises at least one of a summation unit and a reflected signal verification unit for measuring a reflection level.

7. A calibration system comprising a calibration apparatus according to claim 1 and at least one of a signal generator connected to said input terminal and a signal analyzer connected to said output terminal.

8. The calibration system according to claim 7, wherein at least one of said signal generator and said signal analyzer is connected to said calibration apparatus via at least one respective connecting element.

9. The calibration system according to claim 8, wherein said at least one connecting element comprises a cable.

10. The calibration system according to claim 7, wherein said signal generator and said signal analyzer both are in an operational state during a calibration state of said signal generator.

11. The calibration system according to claim 7, wherein said signal generator is in a nonoperational state during a calibration state of said signal analyzer.

12. The calibration system according to claim 7, wherein calibration data for at least one of said signal generator and said signal analyzer is derived from said signal outputted at said terminal output and said signal measured by said signal analyzer.

13. The calibration system according to claim 12, wherein said signal outputted at said terminal output is at least one of a reference signal from said reference signal source combined with a generated signal of said signal generator and a reference signal from said reference signal source alone.

14. The calibration system according to claim 7, wherein said calibration system comprises a controller unit that is connected to at least one of said calibration apparatus, said signal generator, and said signal analyzer for controlling purposes.

15. A method for calibrating at least one of a signal generator or a signal analyzer by using a calibration system comprising at least one of said signal generator or said signal analyzer as well as a calibration apparatus with a pre-calibrated combiner circuit, said method comprising:
    performing at least one of:
        an analyzer calibration, comprising providing a reference signal by a reference signal source of said calibration apparatus, processing said reference signal by the combiner circuit of said calibration apparatus and outputting said reference signal processed at an output terminal of said calibration apparatus, and
        a generator calibration, comprising providing at least a generated signal by said signal generator, processing said generated signal by the combiner circuit of said calibration apparatus and forwarding said generated signal processed to said output terminal of said calibration apparatus;
    the method further comprising determining respective correction parameters obtained during at least one of said analyzer calibration or said generator calibration, said correction parameters corresponding to equalization coefficients.

16. The method according to claim 15, wherein said calibration apparatus is controlled during said analyzer calibration such that a sweep input level at said signal analyzer is provided, wherein said reference signal source outputs a constant power level.

17. The method according to claim 15, wherein said calibration apparatus is controlled during said generator calibration such that a quasi-constant input level at said signal analyzer is maintained.

18. The method according to claim 15, wherein a frequency-power table is generated for at least one of said analyzer calibration and said generator calibration.

19. The method according to claim 15, wherein at least one of said analyzer calibration and said generator calibration is repeated for different center frequencies.

* * * * *